(12) United States Patent  
Hsieh

(10) Patent No.: US 9,110,096 B2  
(45) Date of Patent: Aug. 18, 2015

(54) TEST SOCKET WITH LOWER AND UPPER RETAINING COVER

(71) Applicant: HON HAI PRECISION INDUSTRY CO., LTD., New Taipei (TW)

(72) Inventor: Wen-Yi Hsieh, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 19 days.

(21) Appl. No.: 14/037,401

(22) Filed: Sep. 26, 2013

(65) Prior Publication Data

US 2014/0099816 A1    Apr. 10, 2014

(30) Foreign Application Priority Data

Sep. 26, 2012 (TW) .............................. 101218592 U

(51) Int. Cl.
     *G01R 1/04*            (2006.01)

(52) U.S. Cl.
     CPC .................................... *G01R 1/0466* (2013.01)

(58) Field of Classification Search
     USPC ........................................ 439/331, 59, 73, 55
     See application file for complete search history.

(56) References Cited

U.S. PATENT DOCUMENTS

| | | | | |
|---|---|---|---|---|
| 4,502,747 A * | 3/1985 | Bright et al. | ................... | 439/296 |
| 6,692,279 B1 * | 2/2004 | Ma | ................. | 439/331 |
| 7,182,620 B1 * | 2/2007 | Ju | ................. | 439/331 |
| 8,057,242 B2 * | 11/2011 | Hsu et al. | ......................... | 439/73 |
| 8,460,012 B2 * | 6/2013 | Zhou et al. | ....................... | 439/73 |
| 2006/0166542 A1* | 7/2006 | Hsu | .............................. | 439/331 |
| 2007/0155215 A1* | 7/2007 | Hsu | .............................. | 439/331 |
| 2008/0076272 A1* | 3/2008 | Hsu | ................................ | 439/55 |
| 2014/0099816 A1* | 4/2014 | Hsieh | ............................. | 439/331 |

\* cited by examiner

*Primary Examiner* — Alexander Gilman  
(74) *Attorney, Agent, or Firm* — Wei Te Chung; Ming Chieh Chang

(57) ABSTRACT

A test socket includes an insulating seat defining a package-receiving room and loaded with a plurality of terminals, a retaining member retained on the insulating seat, a first cover and a second cover. The retaining member defines a first end and a second end. The first cover is assembled to the first end of the retaining member via a pivot pin at a lower end thereof. The second cover is assembled to the second end of the retaining member via a second pivot pin at a lower end thereof. The second cover presses against the first cover and is locked after the two covers rotate to close the package-receiving room. The first cover defines a pair of wheels at an upper end thereof and rolling along the second cover during the covers rotate downwards.

18 Claims, 5 Drawing Sheets

US 9,110,096 B2

TEST SOCKET WITH LOWER AND UPPER RETAINING COVER

BACKGROUNDING OF THE INVENTION

1. Field of the Invention

The present invention relates to an electrical test socket for electrically connecting an electronic package such as CPU with a circuit substrate, to test electric performance of the electronic package.

2. Description of the Related Art

Electronic packages, such as integrated circuits (ICs), are miniaturized electronic devices in which a number of active and passive circuit elements are located on or within a continuous body of material to perform the function of a complete circuit. To ensure reliability of ICs prior to marketing, they are required to be burned in. That is, the ICs are operated at high temperature for an extended period of time in order to accelerate any dormant failure mechanisms that may be present. This is intended to eliminate early product failures once the ICs are sold and assembled into end products. A burn-in socket is used to receive an IC therein, so that the IC is electrically connected with a burn-in board.

However, conventional IC sockets do not provide any convenient fastening mechanism for attaching the electronic packages.

In view of the above, an improved test socket that overcomes the above-mentioned disadvantages is desired.

SUMMARY OF THE INVENTION

Accordingly, an object of the present invention is to provide a test socket with a convenient fastening mechanism.

To fulfill the above-mentioned object, a test socket adapted for connecting an electronic package with a circuit substrate comprises an insulating seat defining a package-receiving room for receiving the electronic package and loaded with a plurality of terminals with contacting portions exposed to the package-receiving room, a retaining member retained on the insulating seat and surrounding the plurality of terminals, a first cover and a second cover. The retaining member defines a first end and a second end opposite to the first end. The first cover is assembled to the first end of the retaining member via a pivot pin at a lower end thereof The second cover is assembled to the second end of the retaining member via a second pivot pin at a lower end thereof The second cover presses against the first cover and is locked after the two covers rotate to close the package-receiving room. The first cover defines a pair of wheels at an upper end thereof and rolling along the second cover during said covers rotate downwards.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
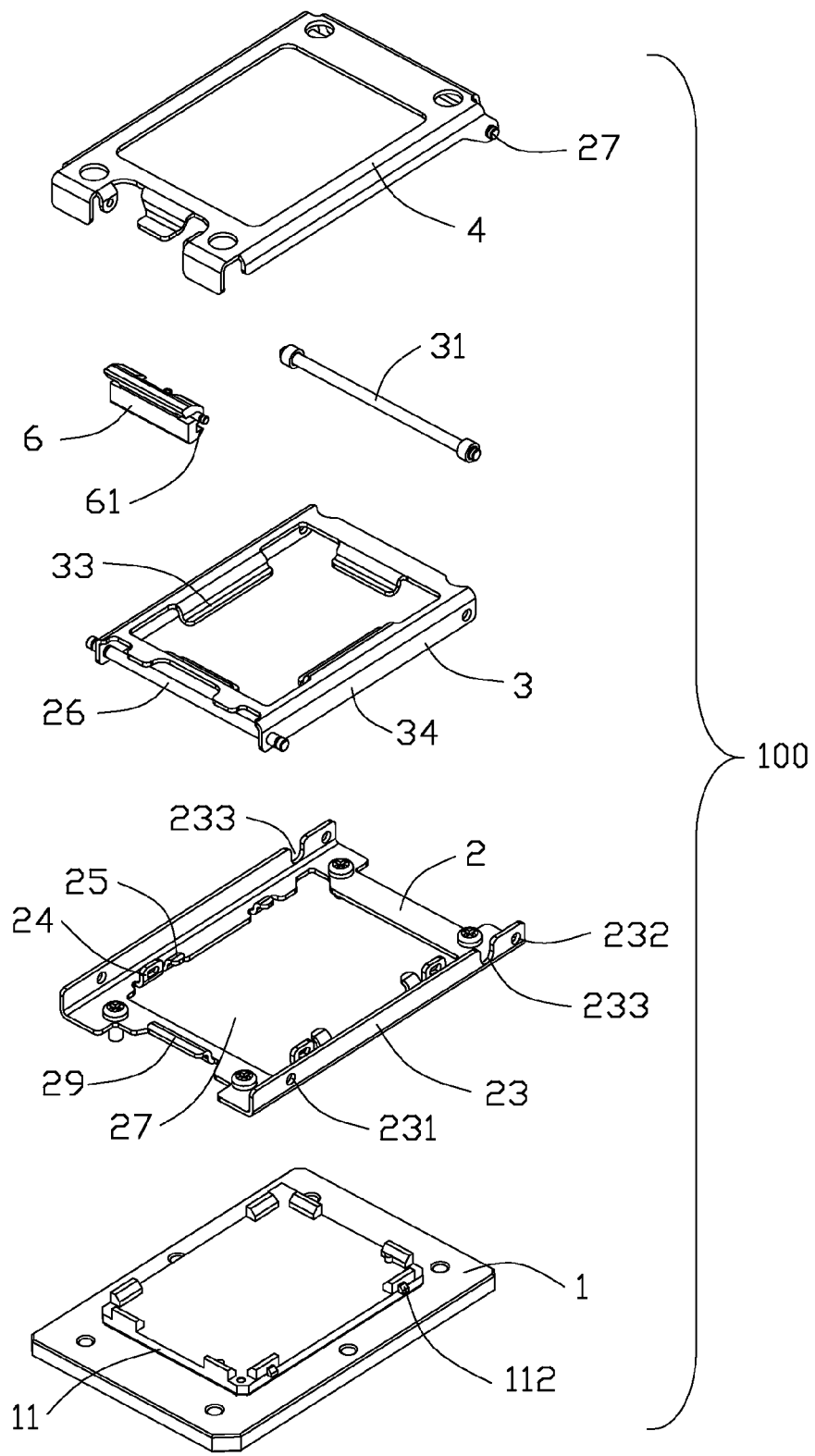
FIG. 1 is an exploded perspective view of a test socket in accordance with a preferred embodiment of the present invention.
Figure 2:
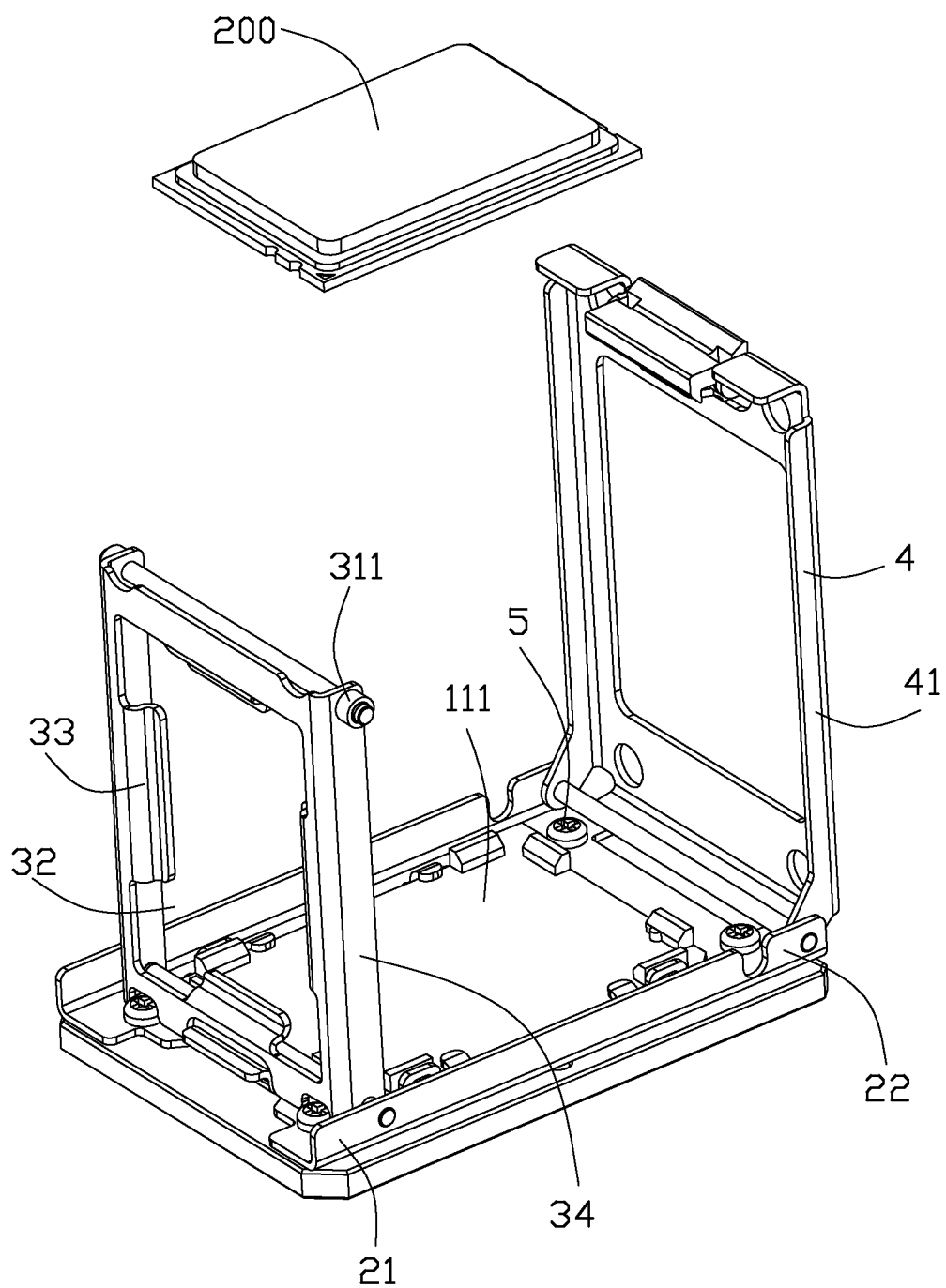
FIG. 2 is a perspective view of the test socket, wherein two covers are in an opening state and an electronic package is ready to be placed into the test socket.

Referring to FIGS. 1 to 2, an electrical test socket 100 for electrically connecting an electronic package 200, such as a central processing unit (CPU), with a circuit substrate, such as a printed circuit board (PCB) (not shown), comprises an insulating seat 1 with a terminal module 11 loading on the insulating seat 1, a retaining member 2 retained on the seat, a first cover 3 and a second cover 4 turnably mounted on the retaining member 2 and rotating downwards related to the insulating seat 1.

The terminal module 11 is retained in the insulating seat 1, which is embedded with an array of terminals (not shown) thereon with contacting portion exposed to an upper surface of the insulating seat. A package-receiving room 111 is defined on the upper surface of the terminal module, which is adapted for receiving the electronic package 200. The terminal module 11 defines bosses 112 projecting outwards.

The retaining member 2 of a rectangular frame with a central opening 27, surrounds the terminal module 11 and retains the terminal module 11 in the seat 1. The retaining member 2 defines opposite first end 21 and second end 22 and comprises two long vertical sides 23 to the seat 1. The vertical sides 23 defines pairs of pivot holes 231, 232 near to the first end and the second end thereof and a pair of receiving notch 233 near to the pivot holes 232 at the second end 22. The retaining member 2 further defines locking holes 24 and spring tabs 25 at opposite long inner edges of the central opening 27. The bosses 112 of the terminal module 11 are snugly engaged with the locking holes 24, thereby the retaining member 2 being assembled on the terminal module 11 and the spring tabs 25 pressing against the upper surface of the terminal module 11. The locking holes 24 and the spring tabs 25 benefit replace of the terminal module 11. The test socket has screws 5, which are tighten to mount the retaining member 2 to the insulating seat 1.

Figure 3:
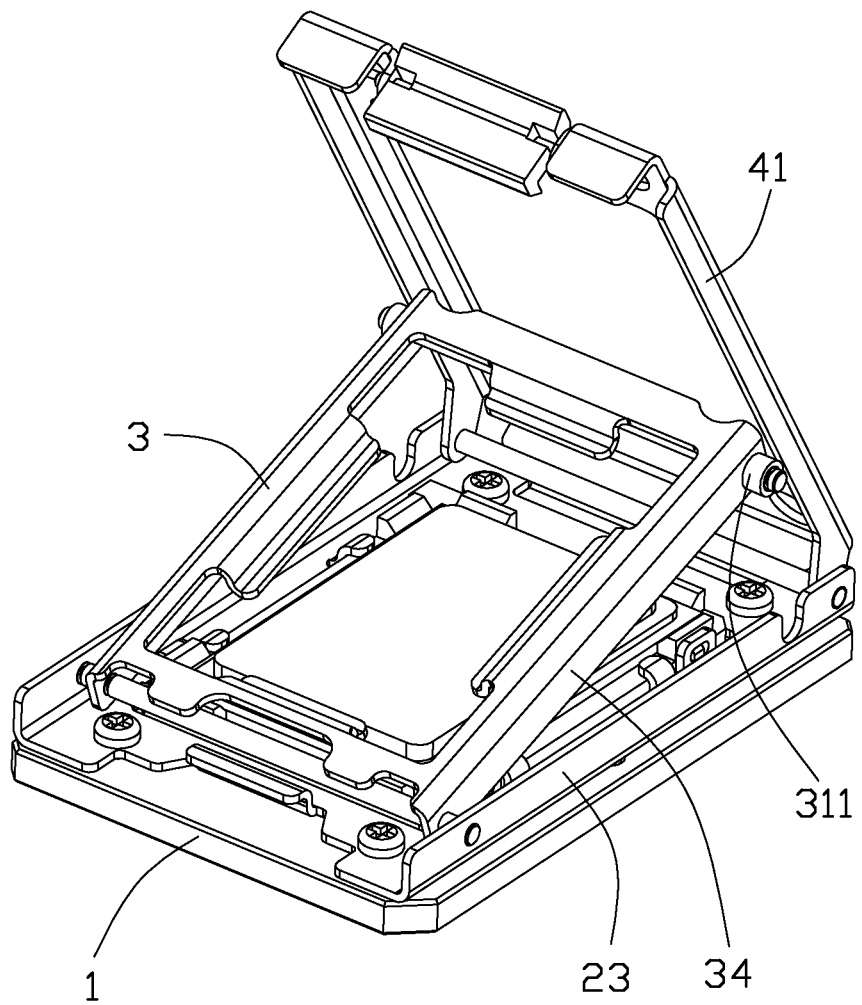
FIG. 3 is a perspective view of the test socket, wherein two covers are rotating downwards after the electronic package is received in the test socket.
Figure 4:
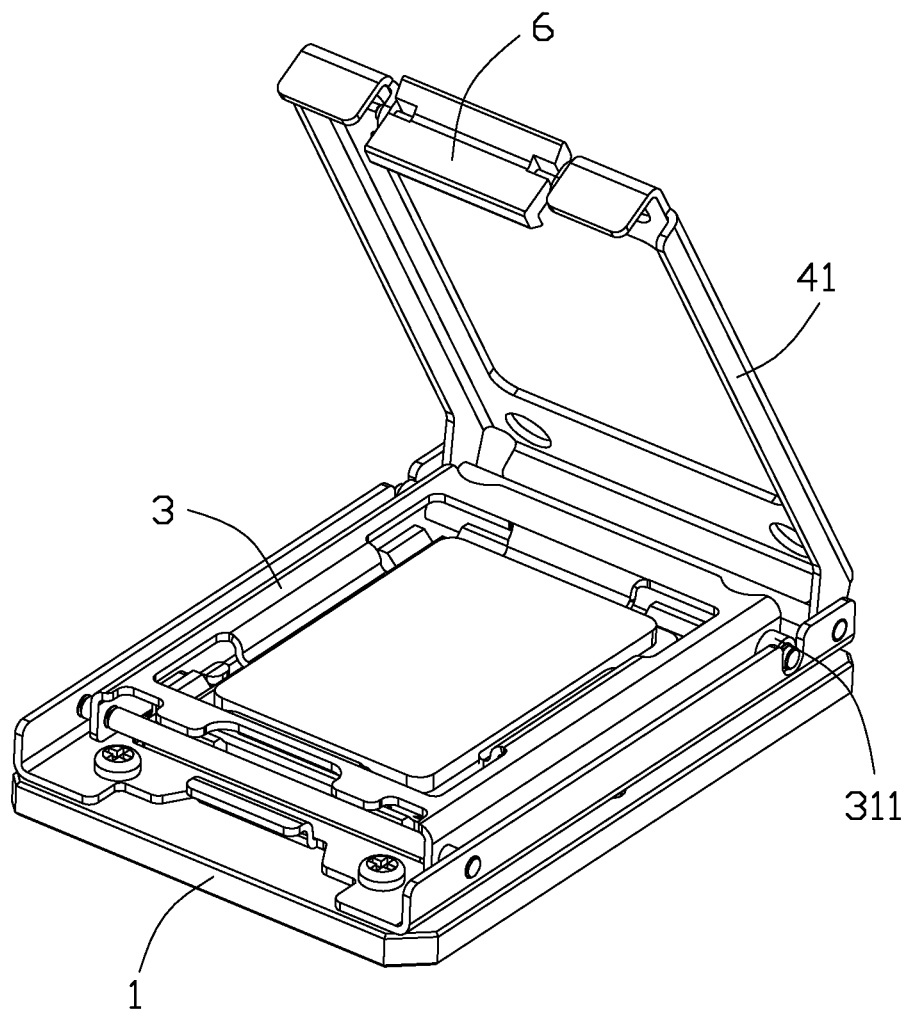
FIG. 4 is a perspective view of the test socket, wherein the first covers is in a closed state.
Figure 5:
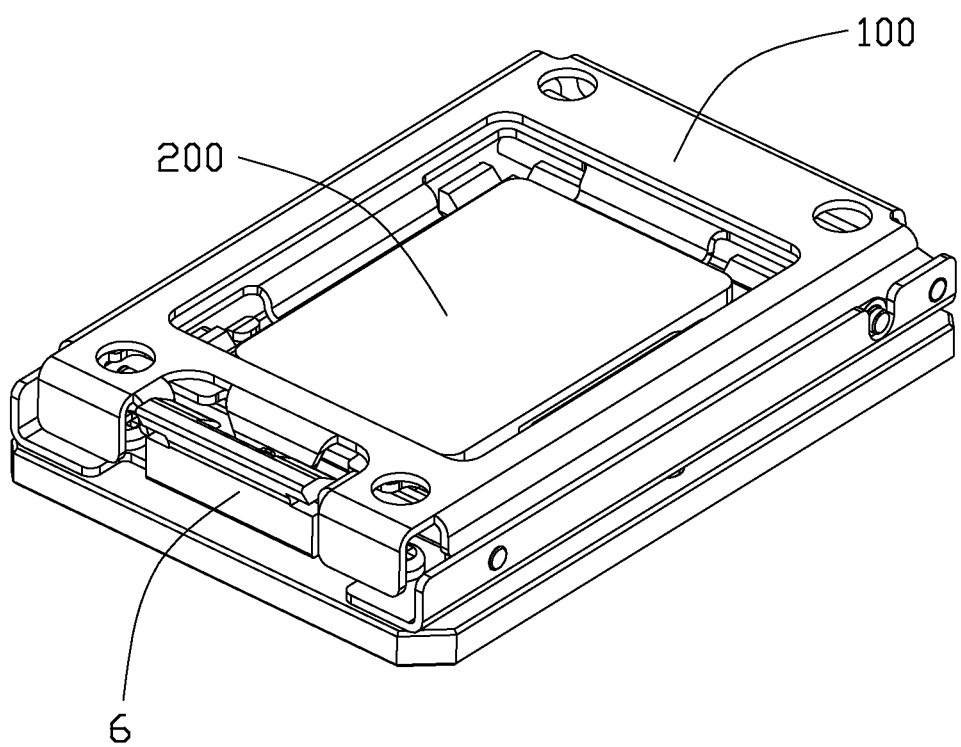
FIG. 5 is a perspective view of the test socket, wherein the second covers is in a closed state.

Combination with FIGS. 3 through 5, the test socket 100 further comprises a first pivot pin 26, a second pivot pin 27 and a third pivot pin 31, which are parallel to each other. The first and the second pivot pins 26, 27 are received in the pivot holes 231, 232 at the first and second ends 21, 22 of the retaining member 2 and said covers 3, 4. A lower end of the first cover 3 is assembled to first pivot pin 26, thereby the first cover 3 rotating around the first pivot pin 26 at the first end 21 of the retaining member 2, and an upper end of the first cover 3 is assembled with the third pivot pin 31. The first cover 3 rotates downwards around the first pivot pin 26, and then press against the electronic package 200 which is placed into the package-receiving room 111. As best shown in FIGS. 3 and 4, a lower end of the second cover 4 is assembled to the second pivot pin 27 at the second end 22 of the retaining member, the second cover 4 rotates downwards until the second cover 4 is locked with the retaining member 2 or the insulating seat 1, thereby the second cover 4 pressing against the first cover 3. As result, the second cover 4 and the first cover 3 commonly pressingly retain the electronic package 200 in the room 111 as shown in FIG. 5.

The first cover 3 of rectangular frame with a central opening 32 corresponding to the electronic package 200, defines pressing pieces 33 at four inner edges of the central opening 32. The pressing pieces 33 are adapted for snugly pressing against the electronic package 200. The first and the second cover define long vertical sides 34, 41 respectively, which are parallel to the long vertical sides 23 of the retaining member. The vertical sides 41 of the second cover 4 are disposed between the vertical sides of the first cover 3 and the retaining member 2. The third pivot pin 31 of the first cover 3 defines a pair of wheels 311 at opposite sides thereof, which roll along the vertical sides 41 of the second cover 4 during the first and second cover rotate downwards as shown in FIG. 3 and finally fall into the receiving notches 233.

The test socket 1 further comprises a locking member 6, which is assembled on the upper end of the second cover 4. The locking member defines a clawer 61 and the retaining member defines a clawing tab 29 bending outwards. When the covers 3, 4 are operated in a close state, the clawer 61 is engaged with the clawing tab 29.

Combination with FIG. 5, the electronic package 200 is placed in the package-receiving room 111 after the first and second covers 3, 4 rotate upwards to an opening state. Then the first and second covers are closed and the locking member 6 is locked with the retaining member 2.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A test socket adapted for connecting an electronic package with a circuit substrate, comprising:
    an insulating seat defining a package-receiving room for receiving the electronic package and loaded with a plurality of terminals with contacting portions exposed to the package-receiving room;
    a retaining member retained on the insulating seat and surrounding the plurality of terminals, the retaining member defining a first end and a second end opposite to the first end;
    a first cover assembled to the first end of the retaining member via a pivot pin at a lower end thereof;
    a second cover assembled to the second end of the retaining member via a second pivot pin at a lower end thereof, the second cover pressing against the first cover and be locked after said two covers rotate to close the package-receiving room; wherein
    the first cover defines a pair of wheels at an upper end thereof and rolling along the second cover during said covers rotate downwards.

2. The test socket as claimed in claim 1, wherein the first cover is assembled with a third pivot pin at the upper end thereof, said pair of wheels is disposed at two opposite ends of the third pivot pin.

3. The test socket as claimed in claim 2, wherein the retaining member defines pairs of pivot holes at the first and second ends thereof to receive said first and second pivot pins, and a pair of receiving notch near to the pivot holes at the second pivot holes to receive said pair of wheels.

4. The test socket as claimed in claim 3, wherein the first cover defines a central opening corresponding to the receiving room and pressing pieces extending toward the receiving room from inner edges of the central opening of the first cover for pressing against the electronic package.

5. The test socket as claimed in claim 4, wherein the test socket comprises a terminal module is assembled in the insulating seat fitly, said terminals are embedded in the terminal module; the terminal module defines projecting bosses, the retaining member defines locking holes and spring tabs thereon, the projecting boss are snugly engaged with the locking holes and the spring tabs press against the terminal module.

6. The test socket as claimed in claim 4, wherein the test socket comprises a lock member assembled on the upper end of the second cover, the retaining member defines a clawer tab engaged with the locking member at the first end thereof.

7. The test socket as claimed in claim 6, wherein the clawer tab of the retaining member unitarily bends upwards and them away from the second end of the retaining member.

8. The test socket as claimed in claim 6, wherein the first and second cover and the retaining member define vertical sides to the insulating seat respectively, the vertical sides of the second cover are located between the vertical sides of the first cover and the vertical sides of the retaining member when the first and second covers rotate downward, the wheels rolls along the vertical sides of the second cover.

9. A test socket comprising:
    a retaining seat defining a package-receiving room and loaded with a plurality of terminals with contacting portions exposed to the package-receiving room; and
    a lower cover and an upper cover assembled to opposite ends of the retaining seat;
    wherein the lower cover defines a pair of wheels at opposite side of an upper end thereof, the lower cover and the upper cover rotate downwards to the package-receiving room under a condition that the lower cover rotates downwards firstly by the pair of wheels rolling along the upper cover and then the upper cover rotates downwards until the upper cover is locking with the retaining seat.

10. A test socket assembly comprising:
    a seat,
    a terminal module mounted upon the seat;
    a metallic retaining member mounted upon the seat and surrounding said terminal module, said retaining member defining opposite first and second ends along a front-to-back direction;
    an electronic package mounted upon the terminal module;
    a metallic lower cover defining opposite third and fourth end, said third end permanently pivotally mounted to the first end of the retaining member, said fourth end up and down pivotally moveable between a raised-up opening position and a horizontal closed position;
    a metallic upper cover defining opposite fifth and sixth ends, said fifth end permanently pivotally mounted to the second end of the retaining member, said sixth end up and down pivotally moveable between a raised-up opening location and a horizontal closed location; wherein
    when the lower cover is moved to the horizontal closed position, the fourth end is located proximate while inside of the second end; furthermore when the upper cover is successively moved to the horizontal closed location to cover the lower cover, the sixth end equipped with a locking member, is latched to a locking position of the retaining member proximate while outside of the first end;
    wherein the electronic package is pressed downwardly by the lower cover, and the lower cover is downwardly pressed only by the upper cover;
    wherein retention of the electronic package upon the terminal module is essentially efficiently derived from latching between the locking member and the retaining member.

11. The test socket assembly as claimed in claim 10, wherein the fourth end is equipped with a pivot pin retainably received in a notch defined in the retaining member around the second end.

12. The test socket assembly as claimed in claim 11, wherein an end of the pivot pin is equipped with a roller.

13. The test socket assembly as claimed in claim 12, wherein said roller is positioned to abut against a corresponding vertical side of the outer cover during rotation when the upper cover and the lower cover are interacted with each other.

14. The test socket assembly as claimed in claim 10, wherein the retaining member includes clawing tab defining said locking position.

15. The test socket assembly as claimed in claim 10, wherein said locking member is pivotal.

16. The test socket assembly as claimed in claim 10, wherein the terminal module is secure to the retaining member.

17. The test socket assembly as claimed in claim 10, wherein said upper cover defines a tab around the sixth end to downward press the lower cover around the third end, when the lower cover is located at the horizontal locking position and the upper cover is located at the horizontal locking location and locked to the retaining member.

18. The test socket assembly as claimed in claim 10, wherein said upper cover downwardly presses the lower cover around the fourth end.

* * * * *